US012610850B2

(12) United States Patent
Kang et al.

(10) Patent No.: US 12,610,850 B2
(45) Date of Patent: Apr. 21, 2026

(54) SEMICONDUCTOR PACKAGE AND METHOD FOR MANUFACTURING THE SAME

(71) Applicant: SAMSUNG ELECTRONICS CO., LTD., Suwon-si (KR)

(72) Inventors: Sung Gu Kang, Suwon-si (KR); Jae Choon Kim, Suwon-si (KR); Hwan Joo Park, Suwon-si (KR); Sung-Ho Mun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 435 days.

(21) Appl. No.: 18/184,386

(22) Filed: Mar. 15, 2023

(65) Prior Publication Data

US 2024/0047290 A1 Feb. 8, 2024

(30) Foreign Application Priority Data

Aug. 8, 2022 (KR) ......................... 10-2022-0098735

(51) Int. Cl.
*H01L 23/31* (2006.01)
*H01L 21/56* (2006.01)
(Continued)

(52) U.S. Cl.
CPC ........ *H01L 23/3128* (2013.01); *H01L 21/565* (2013.01); *H01L 24/16* (2013.01); *H01L 24/32* (2013.01); *H01L 24/48* (2013.01); *H01L 24/73* (2013.01); *H01L 25/105* (2013.01); *H01L 2224/32225* (2013.01); *H01L 2224/48227* (2013.01); *H01L 2224/73204* (2013.01); *H01L 2224/73265* (2013.01);
(Continued)

(58) Field of Classification Search
CPC ............ H01L 23/3128; H01L 23/5384; H01L 23/5385; H01L 23/367; H01L 23/562; H01L 23/40; H01L 21/565; H01L 24/16; H01L 24/32; H01L 24/48; H01L 24/73; H01L 25/105; H01L 25/18; H01L 25/0657; H01L 25/50; H01L 2224/48227; H01L 2224/73204; H01L 2224/73265; H01L 2224/1058; H01L 2224/1094; H01L 2224/06513; H01L 2224/06517; H01L 2225/1058; H01L 2225/1094; H01L 2225/06513; H01L 2225/06517; H01L 2225/06548; H01L 2225/06589; H01L 2225/1023
See application file for complete search history.

(56) References Cited

U.S. PATENT DOCUMENTS 7,372,141 B2 5/2008 Karnezos et al.
9,391,009 B2 * 7/2016 Jang .................. H01L 23/49816
(Continued)

*Primary Examiner* — Dao H Nguyen
(74) *Attorney, Agent, or Firm* — Wolf, Greenfield & Sacks, P.C.

(57) ABSTRACT

A semiconductor package with improved thermal properties is provided. The semiconductor package includes a first package including a first die, an interposer on the first package and including a first area and a second area. A second package is on a top face of the interposer in the second area, and a thermal diffusion structure is on a top face of the interposer in the first area. The thermal diffusion structure is configured so that heat generated in the first die is discharged through the thermal diffusion structure.

20 Claims, 16 Drawing Sheets

(51) Int. Cl.
    *H01L 23/00*       (2006.01)
    *H01L 25/10*       (2006.01)

(52) U.S. Cl.
    CPC ................. *H01L 2225/1058* (2013.01); *H01L 2225/1094* (2013.01); *H01L 2924/3511* (2013.01)

(56)                  References Cited

U.S. PATENT DOCUMENTS

| | | | |
|---|---|---|---|
| 9,713,258 B2 * | 7/2017 | Kwark | H01L 25/165 |
| 9,842,799 B2 | 12/2017 | Jang | |
| 9,978,660 B2 * | 5/2018 | Hung | H01L 23/4334 |
| 10,658,266 B2 | 5/2020 | Kim et al. | |
| 11,302,598 B2 | 4/2022 | Choi et al. | |
| 2014/0327129 A1 * | 11/2014 | Cho | H01L 23/3675 |
| | | | 257/713 |
| 2015/0061095 A1 * | 3/2015 | Choi | H01L 23/5385 |
| | | | 257/777 |
| 2017/0170155 A1 * | 6/2017 | Yu | H01L 24/20 |
| 2020/0411405 A1 * | 12/2020 | Kim | H01L 21/4871 |
| 2021/0249324 A1 | 8/2021 | Wan et al. | |
| 2021/0257277 A1 | 8/2021 | Bertrand et al. | |
| 2022/0045010 A1 | 2/2022 | Shin et al. | |
| 2022/0059514 A1 | 2/2022 | Lee | |
| 2022/0359482 A1 * | 11/2022 | Farooq | H01L 24/05 |

* cited by examiner

Figure 14:
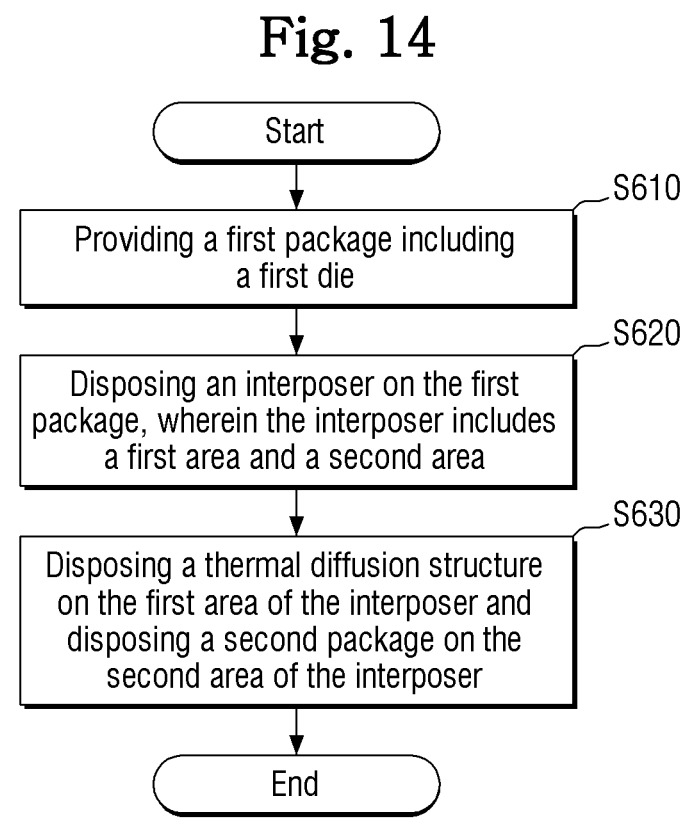

```
┌─────────────────┐
│      Start      │
└─────────────────┘
         │
         ▼                                    ⎯S610
┌────────────────────────────────┐
│  Providing a first package     │
│  including a first die         │
└────────────────────────────────┘
         │
         ▼                                    ⎯S620
┌────────────────────────────────┐
│  Disposing an interposer on    │
│  the first package, wherein    │
│  the interposer includes a     │
│  first area and a second area  │
└────────────────────────────────┘
         │
         ▼                                    ⎯S630
┌────────────────────────────────┐
│  Disposing a thermal diffusion │
│  structure on the first area   │
│  of the interposer and         │
│  disposing a second package    │
│  on the second area of the     │
│  interposer                    │
└────────────────────────────────┘
         │
         ▼
┌─────────────────┐
│       End       │
└─────────────────┘
```

1200

1300

SEMICONDUCTOR PACKAGE AND METHOD FOR MANUFACTURING THE SAME

CROSS-REFERENCE TO RELATED APPLICATION

This application claims priority under 35 U.S.C. § 119 to Korean Patent Application No. 10-2022-0098735, filed on Aug. 8, 2022 in the Korean Intellectual Property Office, the contents of which are herein incorporated by reference in its entirety.

BACKGROUND

Field

The present disclosure relates to semiconductor packages and methods for manufacturing the same.

Description of Related Art

According to the recent trends of miniaturization, weight reduction, high speed, and high performance of electronic components, semiconductor packages mounted therein are being implemented in a form suitable for these electronic components. Various studies are being conducted to improve reliability of the semiconductor package. In particular, because of an increase in power consumption resulting from high speed and increased capacity of electronic components, there is a need to improve thermal properties of semiconductor packages.

SUMMARY

A technical purpose of the present disclosure is to provide semiconductor packages with improved thermal properties.

A technical purpose of the present disclosure is to provide methods for manufacturing semiconductor packages with improved thermal properties.

Purposes according to the present disclosure are not limited to the above-mentioned purposes. Other purposes and advantages according to the present disclosure that are not mentioned may be understood based on following descriptions, and may be more clearly understood based on embodiments according to the present disclosure. Further, it will be understood that the purposes and advantages according to the present disclosure may be realized using means shown in the claims and combinations thereof.

In one aspect of the present disclosure, there is provided a semiconductor package having a first package including a first die, and an interposer on the first package and including a first area and a second area. A second package is on a top face of the interposer in the second area, and a thermal diffusion structure is on a top face of the interposer in the first area. The thermal diffusion structure is configured so that heat generated in the first die is discharged through the thermal diffusion structure.

In one aspect of the present disclosure, there is provided a semiconductor package having a first package including a lower die, an upper die stacked on the lower die, a first thermal interface material (TIM) on the upper die, vertical wiring, and a mold layer covering the lower die, the upper die, a side face of the first TIM, and a side face the vertical wiring. An interposer is on the first package and includes a first area and a second area. The interposer is in contact with a top face of the first TIM and a top face of the vertical wiring. A second package is on a top face of the interposer in the second area, and a thermal diffusion structure is on a top face of the interposer in the first area. The thermal diffusion structure is configured so that heat generated in the lower die or the upper die is discharged through the thermal diffusion structure. The thermal diffusion structure includes a heat sink on the top face of the interposer in the first area, a second TIM is on the heat sink, and a heat slug is in direct contact with the second TIM so as to cover a side face of the heat sink and a side face of the first package. The heat slug is fixed to the package substrate of the first package.

In another aspect of the present disclosure, a method for manufacturing a semiconductor package includes attaching an interposer on a first package, wherein the first package includes a first die, and wherein the interposer includes a first area and a second area; attaching a thermal diffusion structure on the interposer in the first area; and attaching a second package on the interposer in the second area. The thermal diffusion structure is configured so that heat generated in the first die is discharged through the thermal diffusion structure.

Specific details of other embodiments are included in detailed descriptions and drawings.

BRIEF DESCRIPTION OF DRAWINGS

The above and other aspects and features of the present disclosure will become more apparent by describing in detail illustrative embodiments thereof with reference to the attached drawings, in which:

FIG. 4 is a diagram for illustrating an area IV of FIG. 2 in detail;

FIG. 11 is a diagram for illustrating a semiconductor package according to a sixth embodiment of the present disclosure;

FIG. 14 is a diagram for illustrating a method for manufacturing a semiconductor package according to some embodiments of the present disclosure;

DETAILED DESCRIPTIONS

Figure 1:
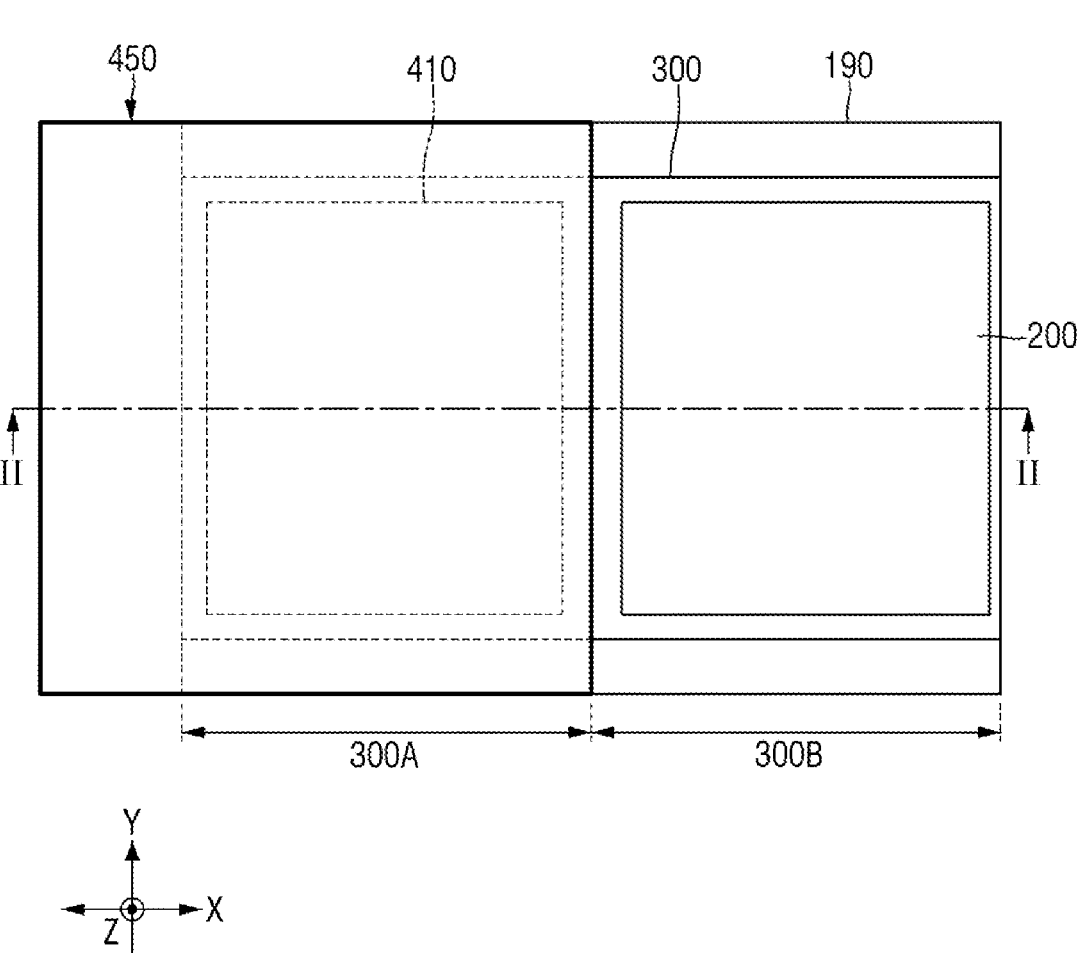
FIG. 1 is a plan view for illustrating a semiconductor package according to a first embodiment of the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc., disclosed in the drawings for illustrating embodiments of the present disclosure are illustrative, and the present disclosure is not limited thereto.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expressions, such as "at least one of", when preceding a list of elements, may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated.

The features of the various embodiments of the present disclosure may be partially or entirely combined with each other, and may be technically associated with each other or operate with each other. The embodiments may be implemented independently of each other and may be implemented together in an association relationship.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings is turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

Figure 2:
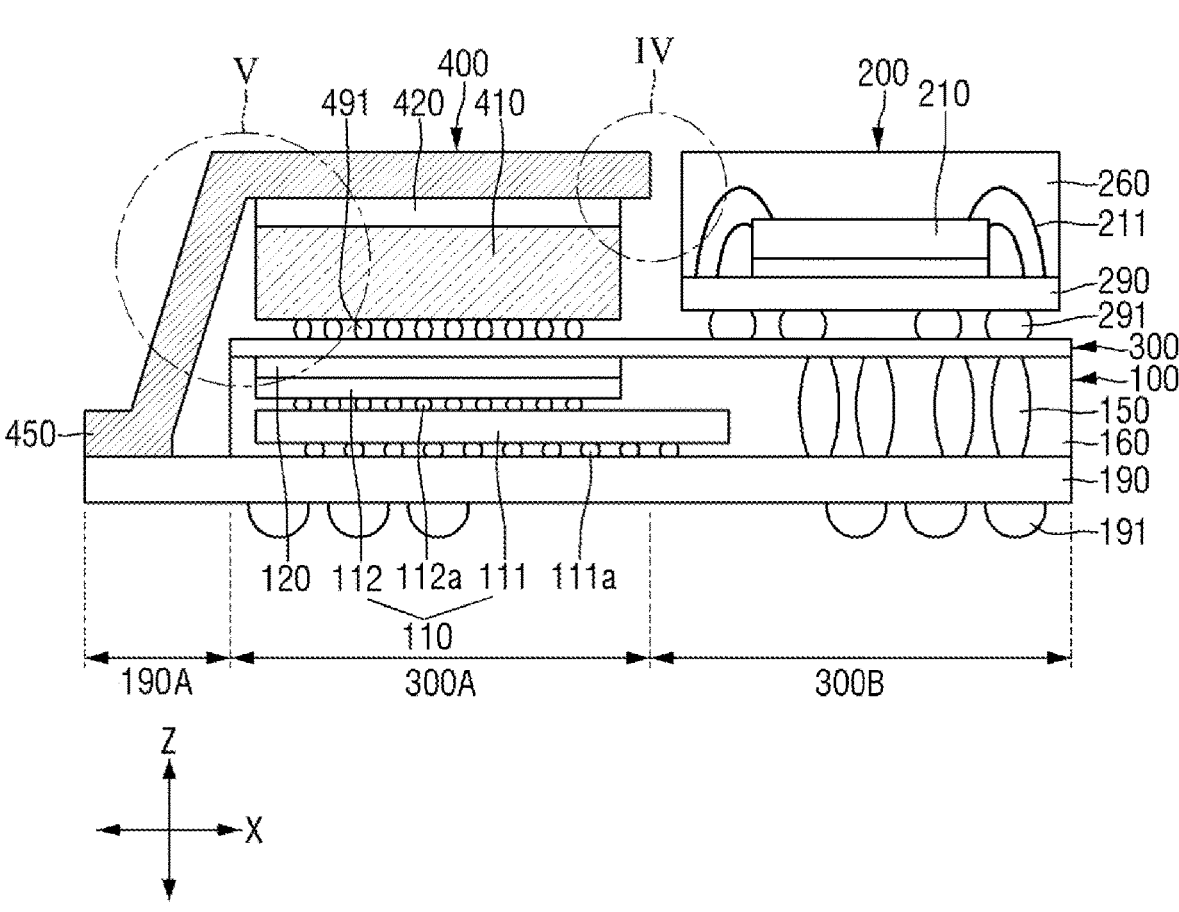
FIG. 2 is a cross-sectional view taken along II-II of FIG. 1.
Figure 3:
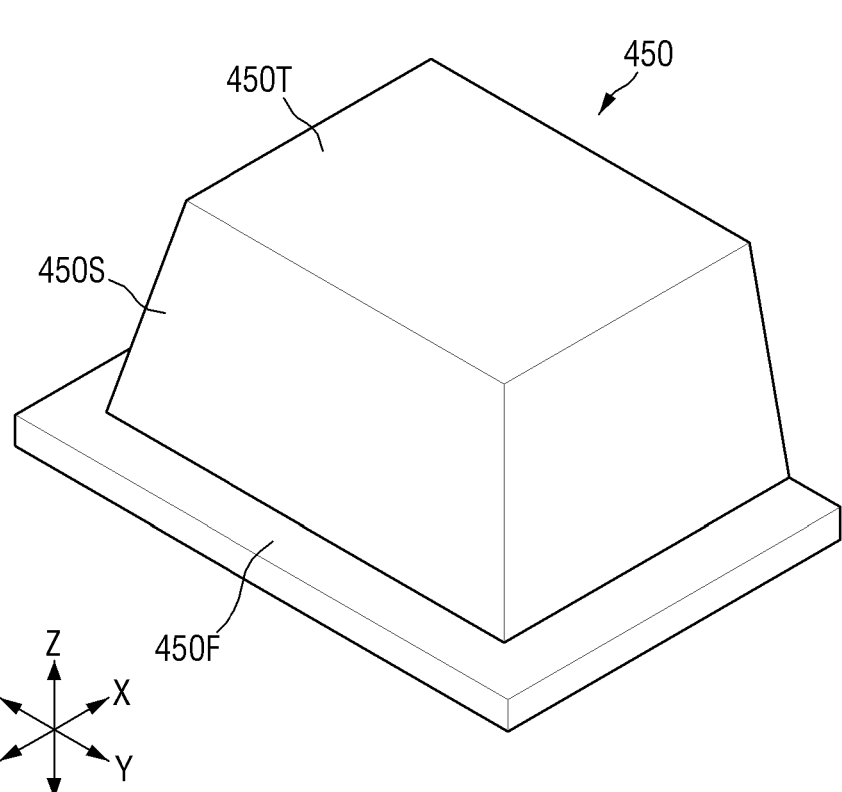
FIG. 3 is a perspective view for illustrating a heat slug shown in FIG. 1.
Figure 4:
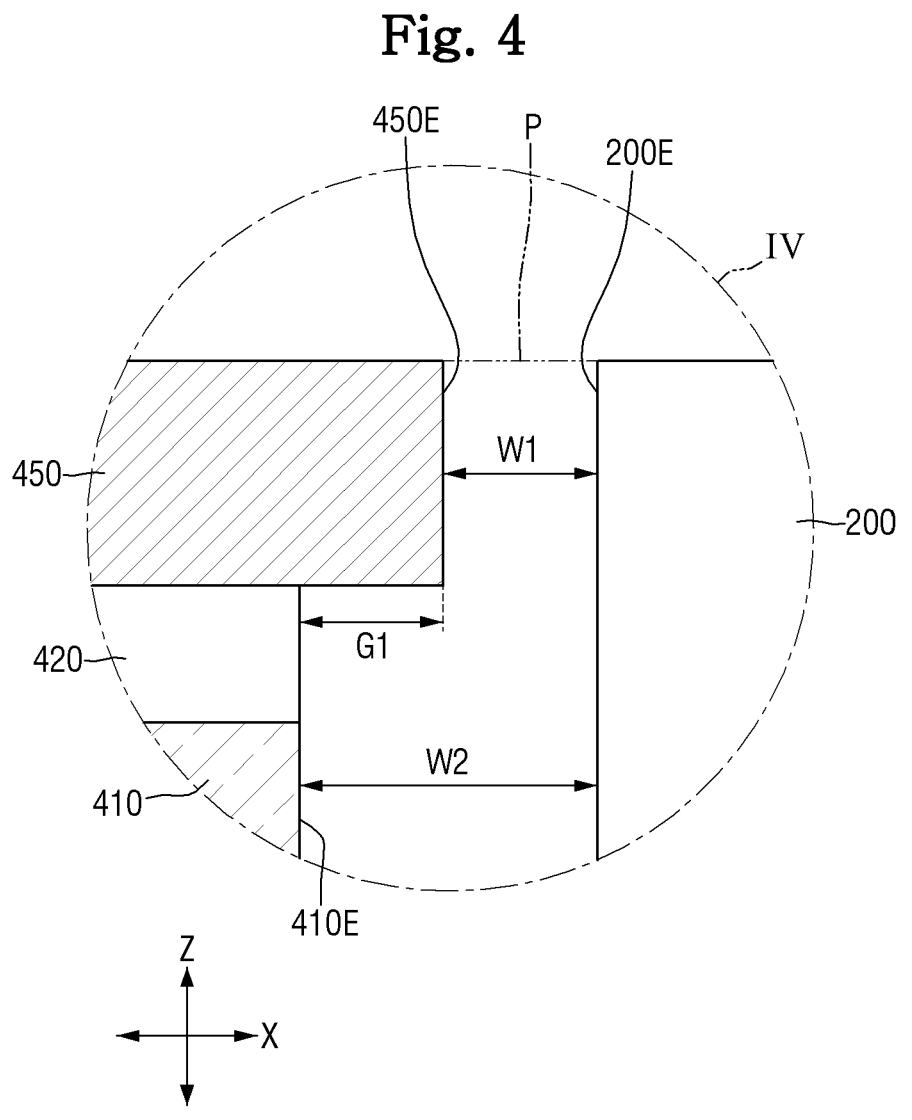
Figure 5:
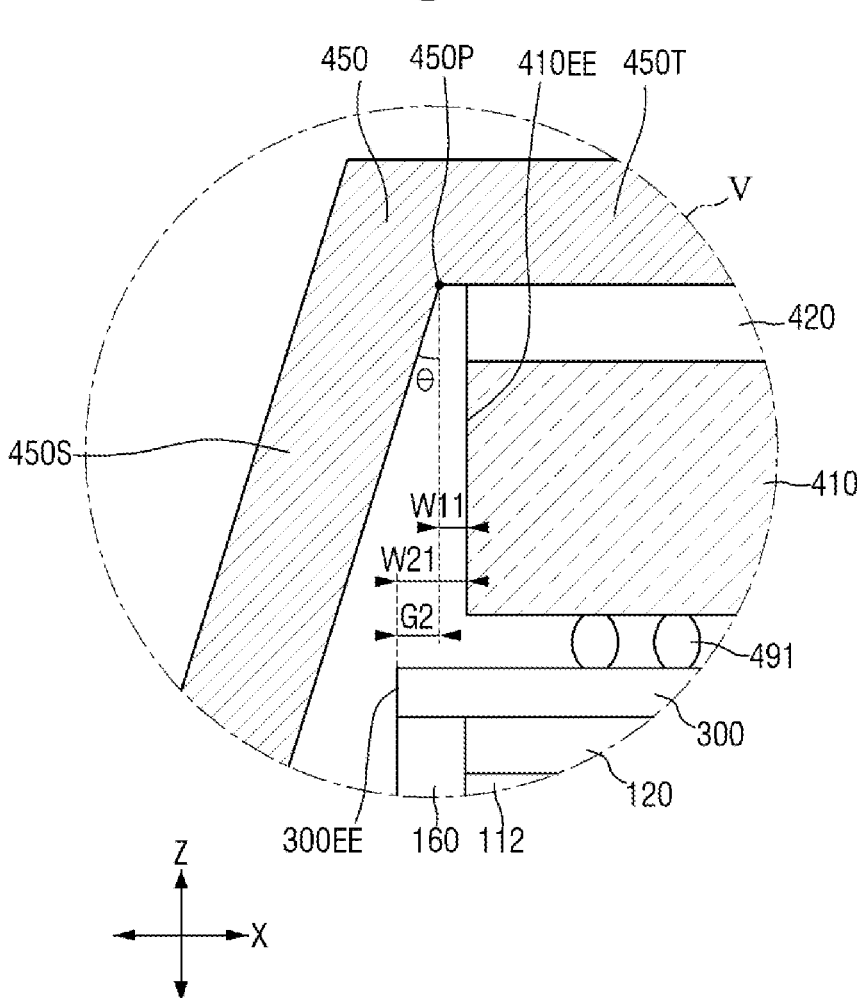
FIG. 5 is a diagram for illustrating an area V of FIG. 2 in detail.
Figure 6:
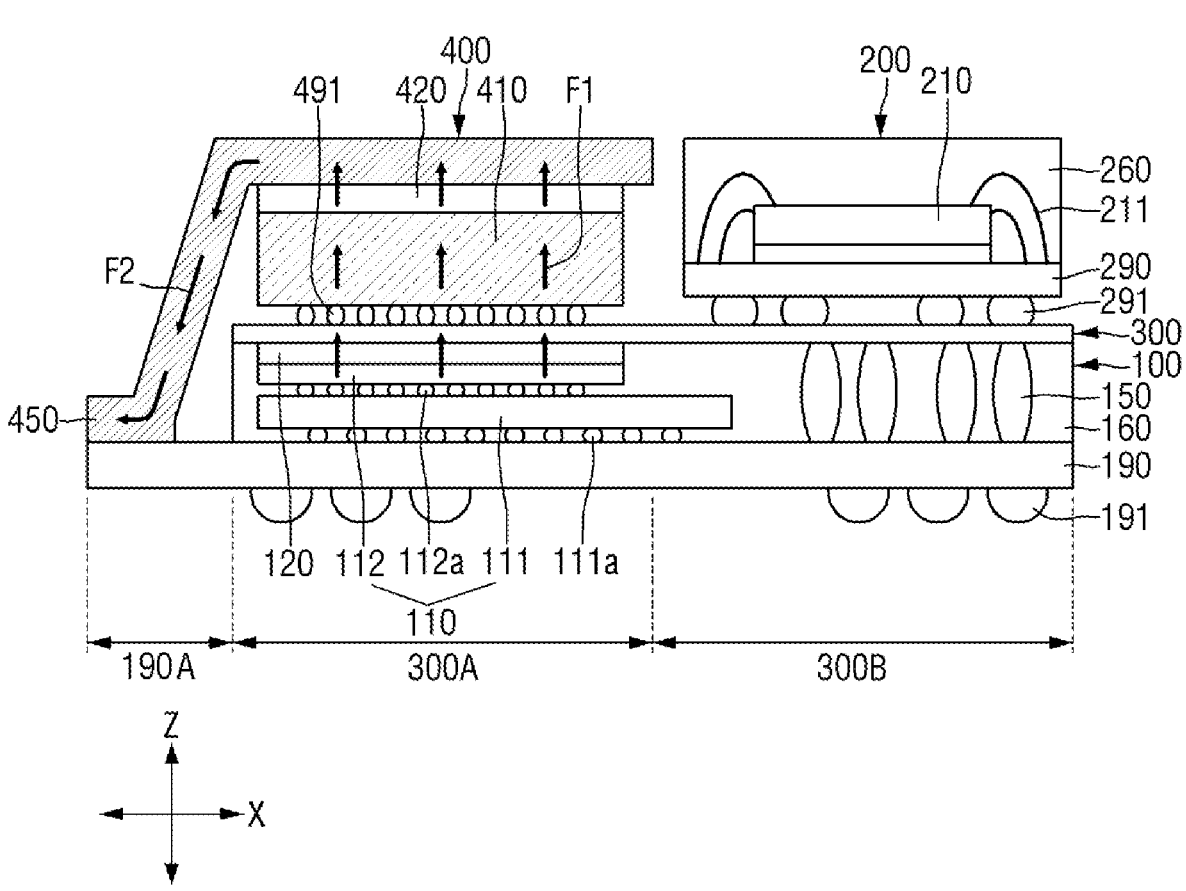
FIG. 6 is a diagram for illustrating an effect of the semiconductor package according to the first embodiment of the present disclosure.

FIG. 1 is a plan view for illustrating a semiconductor package according to a first embodiment of the present disclosure. FIG. 2 is a cross-sectional view taken along II-II of FIG. 1. FIG. 3 is a perspective view for illustrating a heat slug shown in FIG. 1. FIG. 4 is a diagram for illustrating an area IV of FIG. 2 in detail. FIG. 5 is a diagram for illustrating an area V of FIG. 2 in detail. FIG. 6 is a diagram for illustrating an effect of the semiconductor package according to the first embodiment of the present disclosure.

First, referring to FIG. 1 and FIG. 2, the semiconductor package according to the first embodiment of the present disclosure includes a first package 100, an interposer 300, a second package 200, and a thermal diffusion structure 400.

The second package 200 is stacked on the first package 100 in a third direction (z direction). The interposer 300 is disposed between the first package 100 and the second package 200, and the interposer 300 electrically connects the first package 100 and the second package 200 to each other.

The first package 100 may include an integrated circuit, for example, a logic circuit.

The second package 200 may include a memory. The memory may be embodied as a volatile memory such as DRAM (Dynamic Random Access Memory) or SRAM (Static RAM), or as a nonvolatile memory such as flash memory, EPROM (Erasable Programmable Read Only Memory), EEPROM (electrically erasable PROM), RRAM (Resistive RAM), FRAM (Ferroelectric RAM), and the like.

Hereinafter, an example in which the first package 100 includes an AP (application processor) and the second package 200 includes the DRAM will be described.

The first package 100 includes a first substrate (or a package substrate) 190, a first die 110, a vertical wiring 150, a first mold 160, etc.

The first substrate 190 may be embodied as a printed circuit board (PCB) having a circuit pattern. However, the present disclosure is not limited thereto. At least one passive element (e.g., a resistor, a capacitor, etc.) may be installed in the first substrate 190, or on a surface thereof. A first outer terminal 191 may be disposed on a bottom face of the first substrate 190. The first outer terminal 191 may include a conductive material and may have, for example, a shape of a solder ball.

The first die 110 may include one or a plurality of dies. As shown, the first die 110 may include a lower die 111 and an upper die 112 stacked on the lower die 111. The first die 110 may be embodied as an AP chip.

The lower die 111 may be electrically connected to the first substrate 190 via a first connective terminal 111a, while the upper die 112 may be electrically connected to the lower die 111 via a second connective terminal 112a. Each of the first connective terminal 111a and the second connective terminal 112a include a conductive material, and may have, for example, a shape of a solder, a bump or a pillar.

A first TIM (Thermal Interface Material) 120 may be disposed on the first die 110, more specifically, on the upper die 112. The first TIM 120 may include an adhesive material such as a polymer and/or particles with high thermal conductivity, such as a metal.

The vertical wiring 150 is disposed between the first substrate 190 and the interposer 300. The second package 200 may be electrically connected to the first substrate 190 via a second outer terminal 291, the interposer 300, and the vertical wiring 150.

The first mold 160 is disposed on the first substrate 190 so as to fill a space between the first die 110 and the vertical wiring 150, and a space between the first connective terminal 111a and the second connective terminal 112a. The first mold 160 may include, for example, an insulating polymer material such as an epoxy molding compound. Additionally, an underfill film (not shown) may fill a space between the first substrate 190 and the first connective terminal 111a, and a space between the first connective terminal 111a and the second connective terminal 112a.

A landing area 190A of the first substrate 190 is not covered with the first mold 160. As will be described later, the landing area 190A refers to an area in contact with a second portion 450F of a heat slug 450.

In one example, the first mold 160 does not cover a top face of the first TIM 120 and a top face of the vertical wiring 150. Accordingly, the top face of the first TIM 120 and the top face of the vertical wiring 150 may be exposed.

The interposer 300 is disposed on the first package 100. Since the top face of the first TIM 120 and the top face of vertical wiring 150 are not covered with the first mold 160, the interposer 300 may be in direct contact with the first TIM 120 and/or the vertical wiring 150.

The interposer 300 may include a first area 300A and a second area 300B. For example, the first area 300A may be located at one side in a first direction (x direction), for example, may be located at a left side in FIG. 2, while the second area 300B may be located at the other side in the first direction (x direction), for example, may be located at a right side in FIG. 2

The second package 200 is installed on a top face of the interposer 300 and in the second area 300B. The vertical wiring 150 is disposed on a bottom face of the interposer 300 and in the second area 300B.

A thermal diffusion structure 400 is installed on a top face of the interposer 300 and in the first area 300A. The thermal diffusion structure 400 is not installed in the second area 300B.

The second package 200 includes a second substrate 290, a second die 210, a connective wiring 211, and a second mold 260.

The second substrate 290 may be embodied as a printed circuit board (PCB) having a circuit pattern. However, the present disclosure is not limited thereto. At least one passive element such as a resistor, a capacitor, etc., may be installed on a surface of the second substrate 290 or in the second substrate 290. The second outer terminal 291 may be disposed on a bottom face of the second substrate 290. The second outer terminal 291 may include a conductive material and may have, for example, a shape of a solder ball.

The second die 210 may include one or a plurality of dies. As shown, the second die 210 may include two or more dies as stacked. The second die 210 may be embodied as a memory, for example, a DRAM chip.

The second mold 260 is disposed on the second substrate 290 so as to fill a space above the second die 210 and a space between the second die 210 and the connective wiring 211. The second mold 260 may include an insulating polymer material such as an epoxy mold compound.

In one example, the thermal diffusion structure 400 is configured to discharge heat generated in the first package 100, more specifically, the first die 110.

Specifically, the first die 110 of the first package 100 may be embodied as an integrated circuit (logic circuit) that generates a lot of heat.

In this regard, the first die 110 is disposed in the first package 100. An area by which the first die 110 vertically overlaps the first area 300A is larger than an area by which the first die 110 vertically overlaps the second area 300B. For example, as shown, the upper die 112 may be disposed only in the first area 300A and may not be disposed in the second area 300B. A significant portion of the lower die 111 may be disposed in the first area 300A, while the remainder of the lower die 111 may be disposed in the second area 300B.

When, in a plan view, the first die 110 and the second package 200, more specifically, the second die 210 vertically overlap each other, the heat generated from the first die 110 may affect the second package 200. In the semiconductor package according to some embodiments of the present disclosure, an area by which the first die 110 and the second package 200 vertically overlap each other may be minimized, thereby allowing an effect of the heat generated from the first die 110 on the second package 200 to be reduced or minimized.

In addition, the thermal diffusion structure 400 may overlap the first die 110, such that the heat generated in the first die 110 may be discharged through the thermal diffusion structure 400.

The thermal diffusion structure 400 may include a heat sink 410 and a heat slug 450.

The heat sink 410 is installed on a top face of the interposer 300 and in the first area 300A. The heat sink 410 may be embodied as a dummy die or a dummy chip for heat transfer function. The dummy die may include, but is not limited to, silicon (Si). Alternatively, depending on a design, the heat sink 410 may be embodied as a working chip, such as an SRAM or a modem. The heat sink 410 may be connected to the interposer 300 via, for example, a plurality of bumps 491. However, the present disclosure is not limited thereto.

The heat slug 450 is installed to connect a top face of the heat sink 410 and the first substrate 190 to each other. The heat slug 450 may be made of a metal material having high thermal conductivity, such as copper or aluminum. However, the present disclosure is not limited thereto. A second TIM (thermal interface material) 420 may be disposed between the heat slug 450 and the heat sink 410. Since the second TIM 420 contains particles with high thermal conductivity, the second TIM 420 may efficiently transfer heat from the heat sink 410 to the heat slug 450.

In this regard, referring to FIG. 3, the heat slug 450 includes a first portion (a top) 450T facing a top face of the heat sink 410, the second portion (a foot) 450F facing a top face of the first substrate 190, and a third portion (a side) 450S to connect the first portion 450T and the second portion 450F to each other. The third portion 450S may be formed to cover a side face of the first package 100 and a side face of the heat sink 410.

The second portion 450F is fixed to the landing area 190A of the first substrate 190. Since the first die 110 of the first package 100 is located at one side in the first direction (x direction), for example, at the left side in FIG. 2, the first substrate 190 may be vulnerable to warpage. Fixing the heat slug 450 to the top face of the first substrate 190 as well as the top face of the heat sink 410 may allow the warpage of the first substrate 190 to be prevented. In particular, since the second portion 450F is connected to the top face of the first substrate 190 at three areas thereof, the warpage of the first substrate 190 may be prevented.

In addition, the third portion 450S may be located in three side areas of the package other than one side area thereof in which the second package 200 is located. That is, the third portion 450S may cover both opposing side faces in the second direction (y direction) of the heat sink 410, and cover one side face in the first direction (x direction) of the heat sink 410.

Referring to FIG. 4, a distance W1 between the heat slug 450 and the second package 200 and a distance W2 between the heat sink 410 and the second package 200 may be different from each other. The distance W1 may be smaller than the distance W2.

In this regard, the distance W1 may be a spacing between faces of the heat slug 450 and the second package 200 facing each other (i.e., opposing faces). The distance W2 may be a spacing between faces of the heat sink 410 and the second package 200 facing each other (i.e., opposing faces). That is, the distance W1 between the heat slug 450 and the second package 200 may refer to a distance between a side face 450E of the heat slug 450 and a side face 200E of the second package 200. The distance W2 between the heat sink 410 and the second package 200 may refer to a distance between a side face 410E of the heat sink 410 and a side face 200E of the second package 200.

Alternatively, the side face 450E of the heat slug 450 may protrude beyond the side face 410E of the heat sink 410 in a direction toward the second package 200 (See a first spacing G1).

When side face 450E of the heat slug 450 protrudes beyond the side face 410E of the heat sink 410 in a direction toward the second package 200, heat flow that may occur in a space between the heat sink 410 and the second package 200 may be guided toward the protruding portion of the heat slug 450 and thus may be discharged through the heat slug 450.

In one example, as shown in FIG. 4, the top face of the heat slug 450 and the top face of the second package 200 may be coplanar with each other and thus may constitute the same plane P. Thus, another structure, for example, a heat-dissipating plate may be disposed on the top faces of the heat slug 450 and the second package 200.

Referring to FIG. 5, the first portion 450T and the third portion 450S of the heat slug 450 are connected to each other at a bending point 450P. That is, an angle between a line perpendicular to the first portion 450T and the third portion 450S at the bending point 450P may be an acute angle θ.

In one example, a horizontal distance W11 from a side face 410EE of the heat sink 410 to the bending point 450P and a horizontal distance W21 from the side face 410EE of the heat sink 410 to a side face 300EE of the interposer 300 may be different from each other. The horizontal distance W21 may be greater than the horizontal distance W11.

The side face 300EE of the interposer 300 may protrude beyond the side face 410EE of the heat sink 410 in a direction toward the third portion 450S (See a second spacing G2).

In particular, the bending point 450P is located between the side face 410EE of the heat sink 410 and the side face 300EE of the interposer 300 in the first direction (x direction). Further, the angle between a line perpendicular to the first portion 450T and the third portion 450S of the heat slug 450 at the bending point 450P becomes the acute angle θ. Based on this configuration, a size of an entirety of the semiconductor package may be minimized. If the bending point 450P is located beyond the side face 300EE of the interposer 300 in the direction toward the third portion 450S, the size of the entirety of the semiconductor package may be larger. Further, since the spacing between the side face 410EE of the heat sink 410 and the heat slug 450 may be minimized, the heat from the heat sink 410 may be more efficiently transferred.

Hereinafter, a heat dissipation operation is described with reference to FIG. 6. The heat generated in the first die 110 rises up to the heat sink 410 positioned to overlap the first die 110 (See a reference numeral F1). The heat is transferred to the heat slug 450 through the heat sink 410. A portion of the transferred heat may be discharged upwardly from the heat slug 450, and a portion thereof may be transferred along the first portion 450T, the third portion 450S, and the second portion 450F of the heat slug 450 and may be discharged (See a reference numeral F2).

Figure 7:
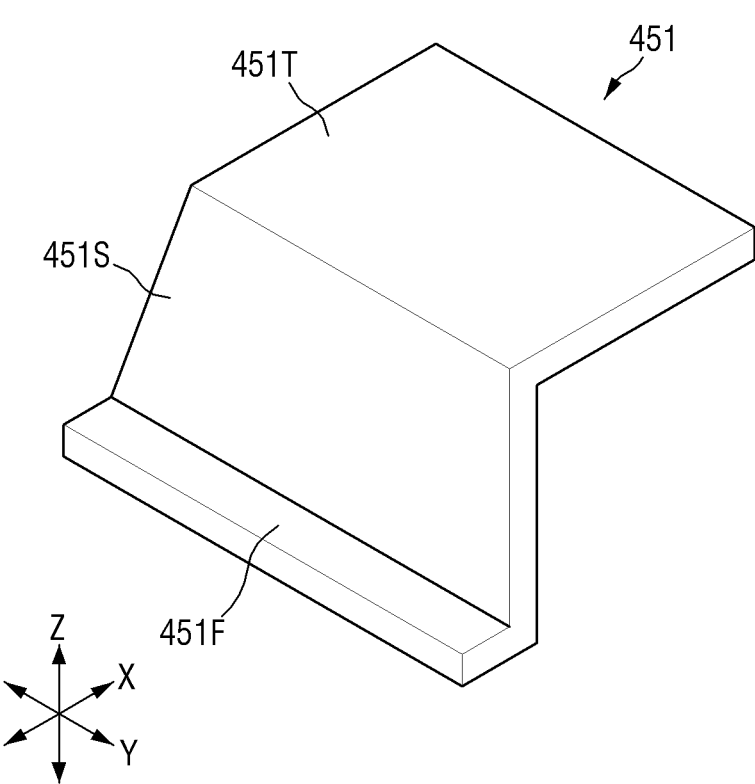
FIG. 7 is a diagram for illustrating a semiconductor package according to a second embodiment of the present disclosure.

FIG. 7 is a diagram for illustrating a semiconductor package according to a second embodiment of the present disclosure. For convenience of description, the following description is mainly based on differences thereof from the above descriptions set forth with reference to FIG. 1 to FIG. 6.

Referring to FIG. 7, a heat slug 451 used in the semiconductor package according to the second embodiment of the present disclosure includes a first portion 451T facing the top face of the heat sink 410, a second portion 451F facing the top face of the first substrate 190, and a third portion 451S connecting the first portion 451T and the second portion 451F to each other. The third portion 451S does not cover both opposing side faces in the second direction (y-direction) of the heat sink 410. The third portion 451S covers one side face in the first direction (x-direction) of the heat sink 410. The third portion 451S does not cover a side face of the second package 200.

Figure 8:
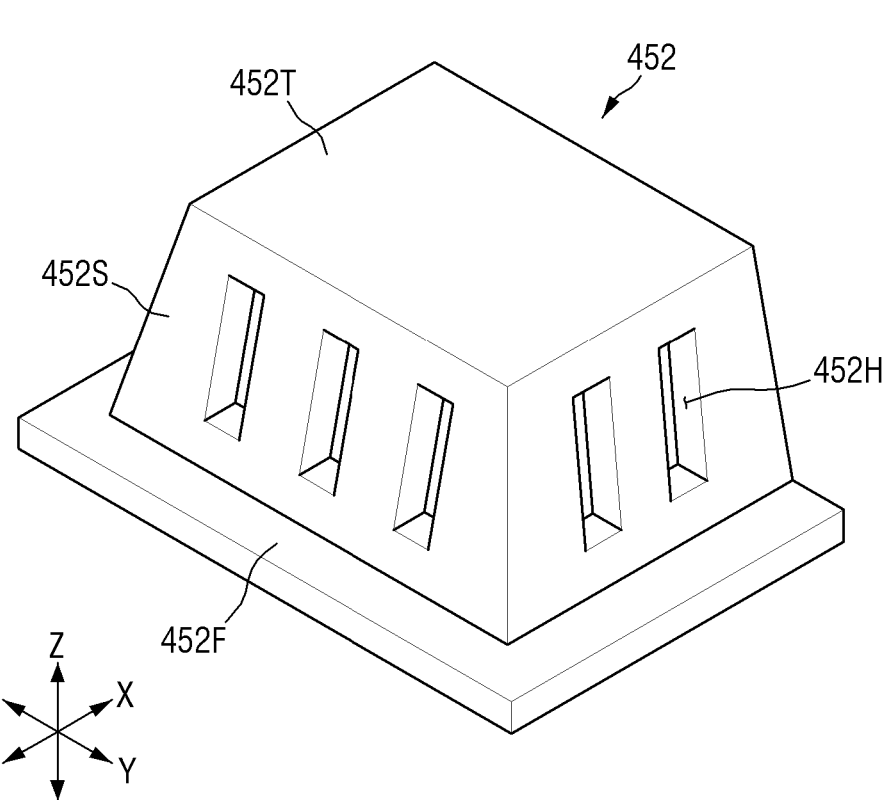
FIG. 8 is a diagram for illustrating a semiconductor package according to a third embodiment of the present disclosure.

FIG. 8 is a diagram for illustrating a semiconductor package according to a third embodiment of the present disclosure. For convenience of description, the following description is mainly based on differences thereof from the above descriptions set forth with reference to FIG. 1 to FIG. 6.

Referring to FIG. 8, a heat slug 452 used in the semiconductor package according to the third embodiment of the present disclosure includes a first portion 452T facing the top face of the heat sink 410, a second portion 452F facing the top face of the first substrate 190, and a third portion 452S connecting the first portion 452T and the second portion 452F to each other. The third portion 452S may have at least one hole 452H defined therein. The heat inside the heat slug 452 may be discharged through the at least hole 452H.

Figure 9:
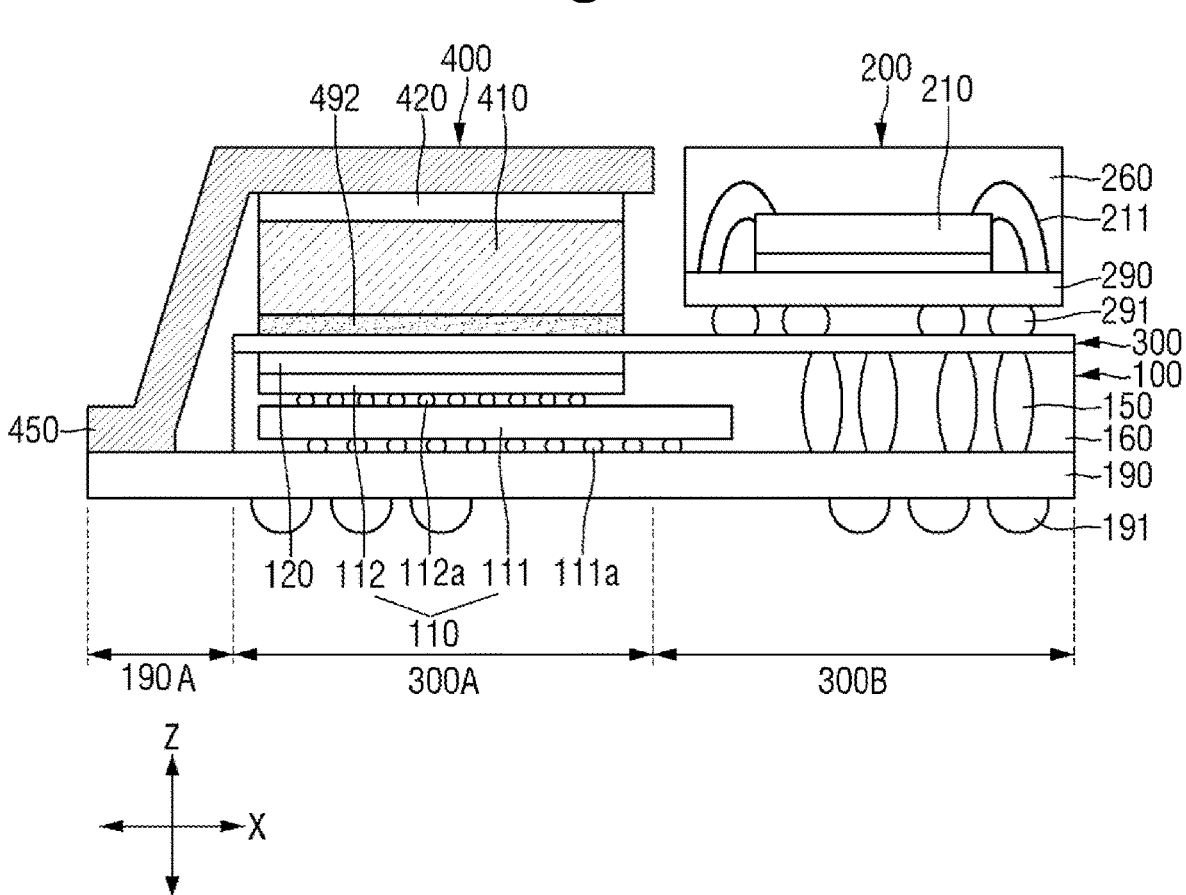
FIG. 9 is a diagram for illustrating a semiconductor package according to a fourth embodiment of the present disclosure.

FIG. 9 is a diagram for illustrating a semiconductor package according to a fourth embodiment of the present disclosure. For convenience of description, the following description is mainly based on differences thereof from the above descriptions set forth with reference to FIG. 1 to FIG. 6.

Referring to FIG. 9, in the semiconductor package according to the fourth embodiment of the present disclosure, the heat sink 410 may be fixed to the interposer 300 using an adhesive 492. When the heat sink 410 is embodied as a dummy die, signal exchange between the dummy die and the first package 100 is unnecessary. Therefore, the dummy die 410 may be fixed to the interposer 300 via the adhesive 492.

Figure 10:
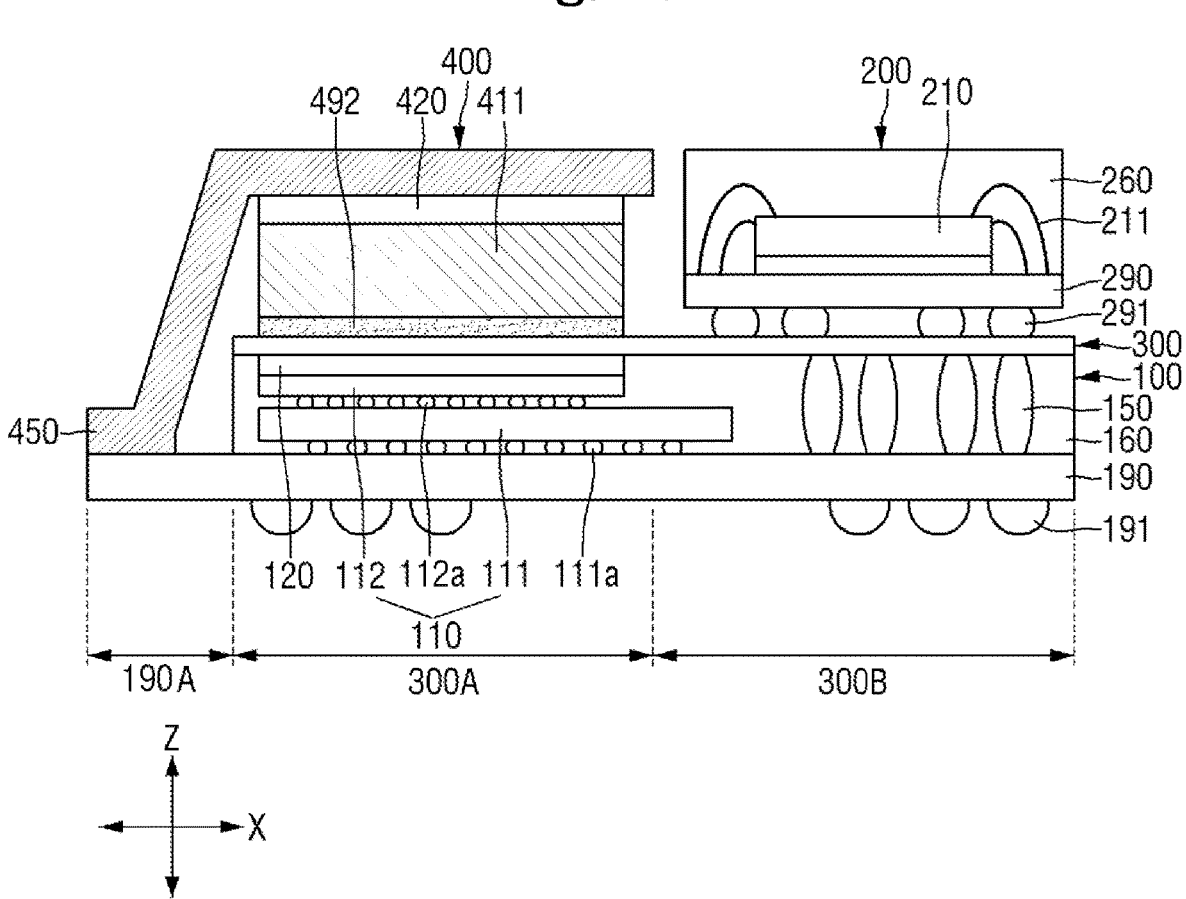
FIG. 10 is a diagram for illustrating a semiconductor package according to a fifth embodiment of the present disclosure.

FIG. 10 is a diagram for illustrating a semiconductor package according to a fifth embodiment of the present disclosure. For convenience of description, the following description is mainly based on differences thereof from the above descriptions set forth with reference to FIG. 9.

Referring to FIG. 10, in the semiconductor package according to the fifth embodiment of the present disclosure, a heat sink 411 may be embodied as a metal layer. The heat sink 411 may include, but is not limited to, a metal material having high thermal conductivity, such as copper or aluminum. When the heat sink 411 is made of the metal, signal exchange between the metal and the first package 100 is unnecessary. Therefore, the heat sink 411 may be fixed to the interposer 300 via the adhesive 492.

Figure 11:
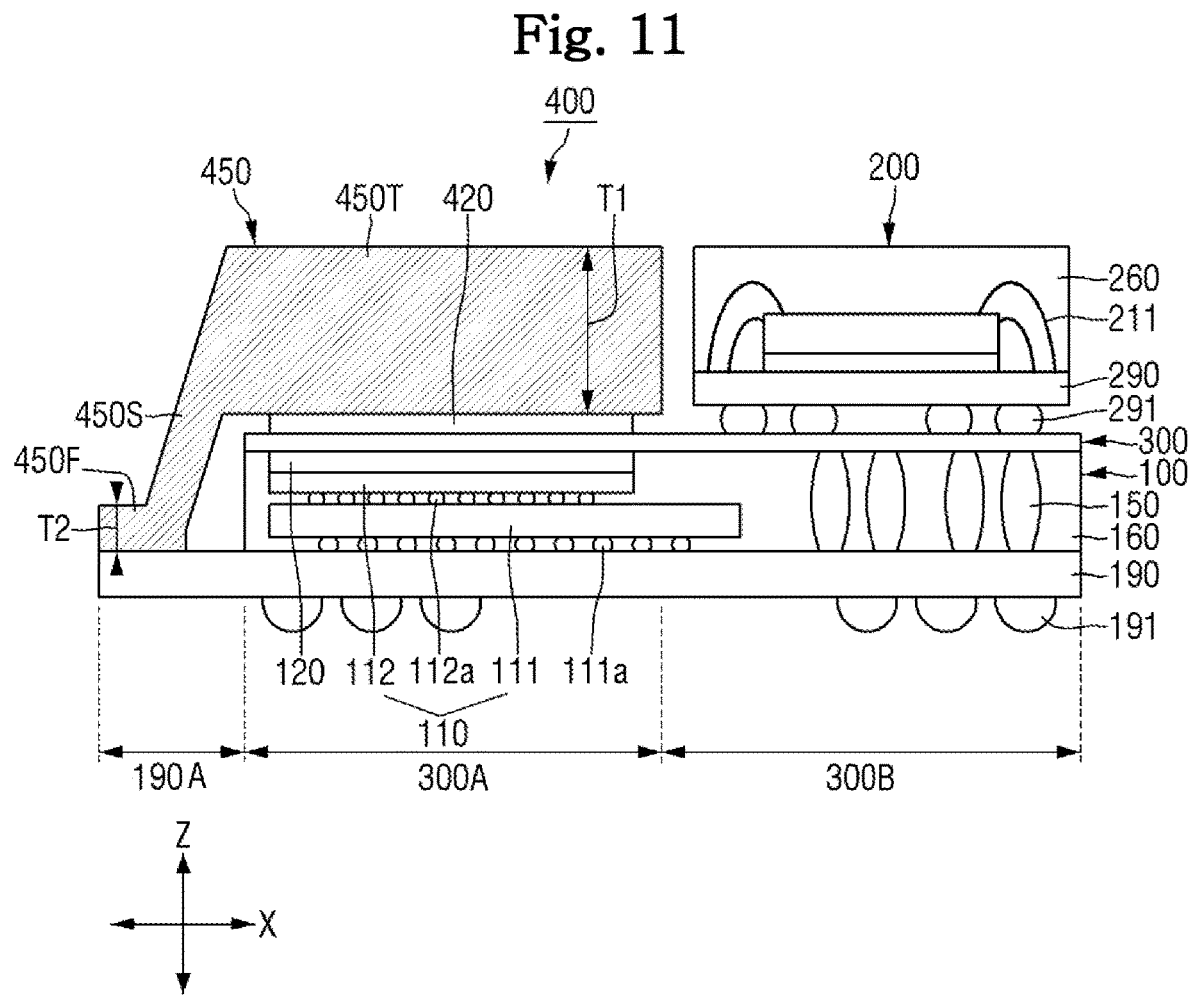

FIG. 11 is a diagram for illustrating a semiconductor package according to a sixth embodiment of the present disclosure. For convenience of description, the following description is mainly based on differences thereof from the above descriptions set forth with reference to FIG. 1 to FIG. 6.

Referring to FIG. 11, in the semiconductor package according to the sixth embodiment of the present disclosure, the thermal diffusion structure 400 does not include the heat sink 410 or 411. As shown, the thermal diffusion structure 400 includes the heat slug 450, and the heat slug 450 is connected to the interposer 300 via the second TIM 420.

The heat slug 450 includes the first portion 450T facing the top face of the interposer 300, the second portion 450F facing the top face of the first substrate 190, and the third portion 450S connecting the first portion 450T and the second portion 450F to each other.

In this regard, a thickness T1 of the first portion 450T may be larger than a thickness T2 of the second portion 450F. When the thickness T1 of the first portion 450T is sufficiently large, the heat generated in the first die 110 may be efficiently discharged to an outside (i.e., away from the underlying first die 110).

Further, when the thickness T1 of the first portion 450T is sufficiently large, a top face of the heat slug 450 and a top face of the second package 200 may be coplanar with each other and thus may constitute the same plane P. Thus, another structure, for example, a heat-dissipating plate may be disposed on the top faces of the heat slug 450 and the second package 200.

Figure 12:
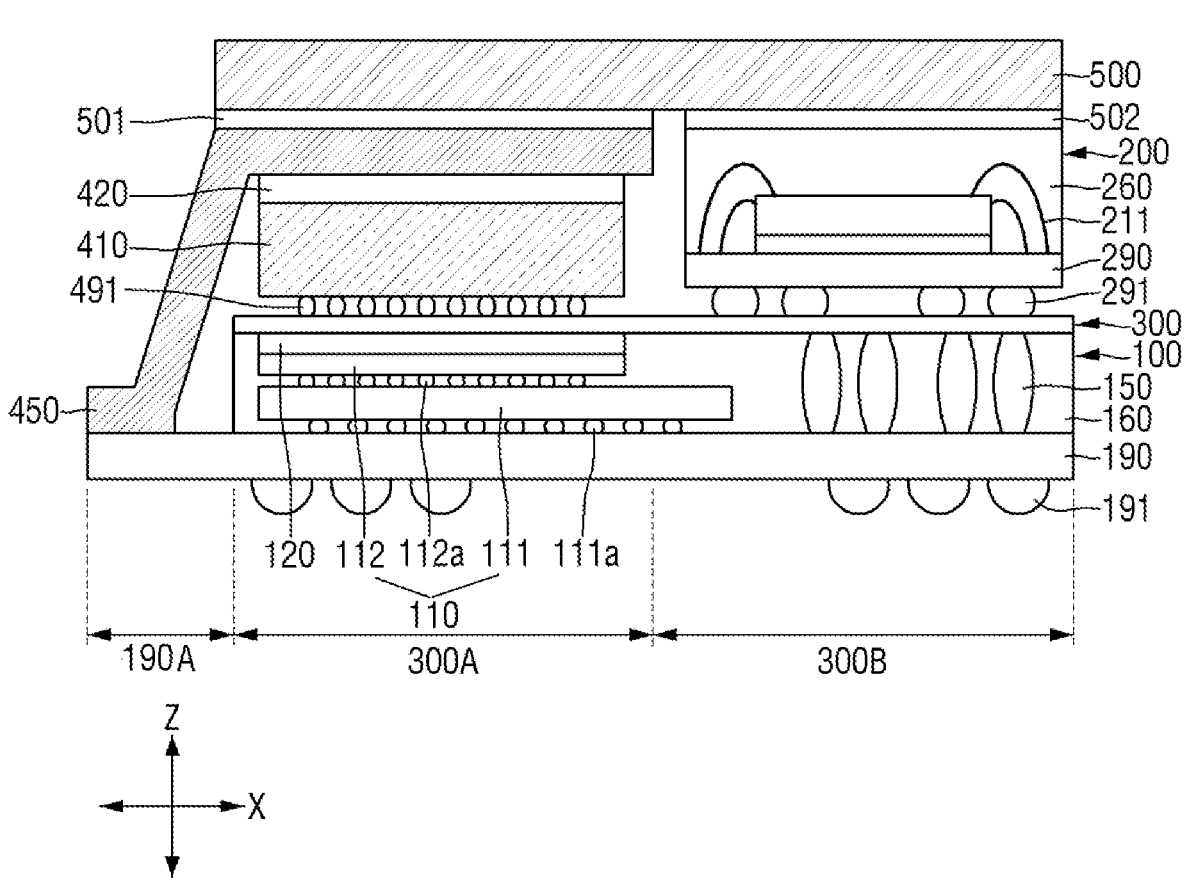
FIG. 12 is a diagram for illustrating a semiconductor package according to a seventh embodiment of the present disclosure.

FIG. 12 is a diagram for illustrating a semiconductor package according to a seventh embodiment of the present disclosure. For convenience of description, following description is mainly based on differences thereof from the above descriptions set forth with reference to FIG. 1 to FIG. 6.

Referring to FIG. 12, in the semiconductor package according to the seventh embodiment of the present disclosure, a heat-dissipating plate 500 may be disposed on the thermal diffusion structure 400 and the second package 200.

The heat-dissipating plate 500 may be made of a metal material having high thermal conductivity, such as copper or aluminum. However, the present disclosure is not limited thereto. The heat-dissipating plate 500 may include bent, convex and/or concave portions to increase a surface area.

The heat-dissipating plate 500 is connected to the thermal diffusion structure 400 via a first material layer 501, and is connected to the second package 200 via a second material layer 502. Each of the first and second material layers 501 and 502 may be made of TIM (thermal interface material) or an adhesive.

Figure 13:
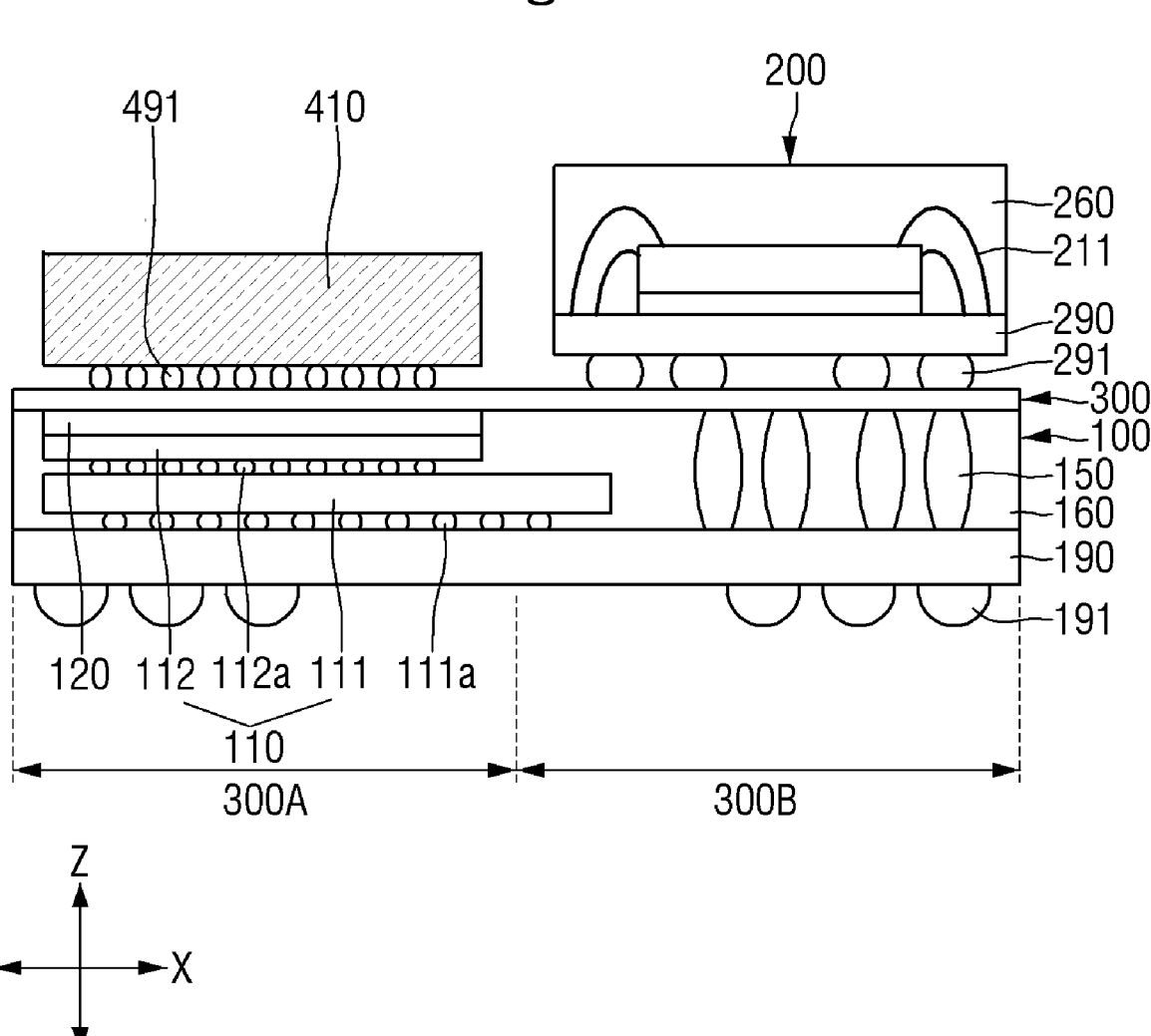
FIG. 13 is a diagram for illustrating a semiconductor package according to an eighth embodiment of the present disclosure.

FIG. 13 is a diagram for illustrating a semiconductor package according to an eighth embodiment of the present disclosure. For convenience of description, the following description is mainly based on differences thereof from the above descriptions set forth with reference to FIG. 1 to FIG. 6.

Referring to FIG. 13, in the semiconductor package according to the eighth embodiment of the present disclosure, the thermal diffusion structure 400 may be free of the heat slug 450 and may include only the heat sink 410. The heat sink 410 may be embodied as a dummy die or may be made of a metal.

Using FIG. 14 to FIG. 16 and FIG. 2, a method for manufacturing a semiconductor package according to some embodiments of the present disclosure will be described.

Figure 15:
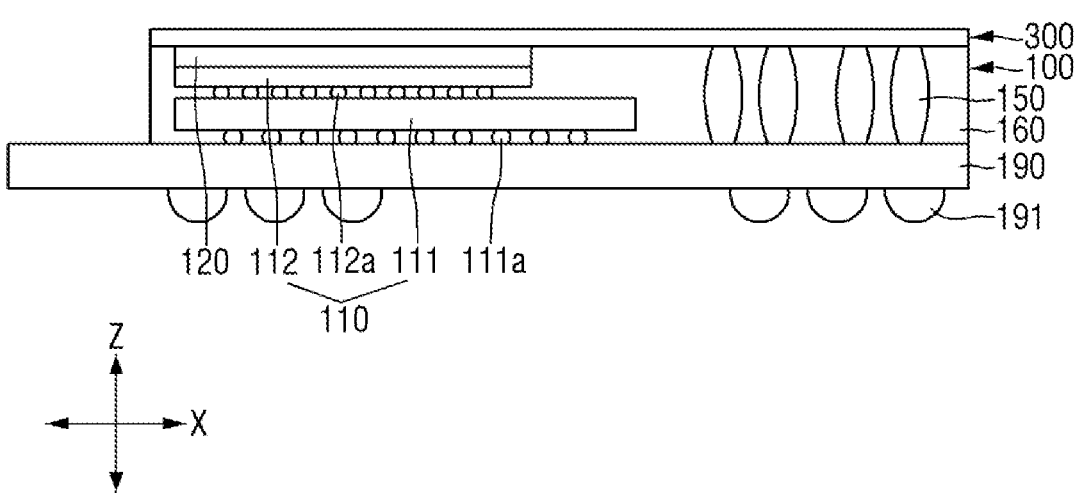
FIG. 15 and FIG. 16 are diagrams of intermediate structures corresponding to intermediate steps for illustrating a method for manufacturing a semiconductor package according to some embodiments of the present disclosure.
Figure 16:
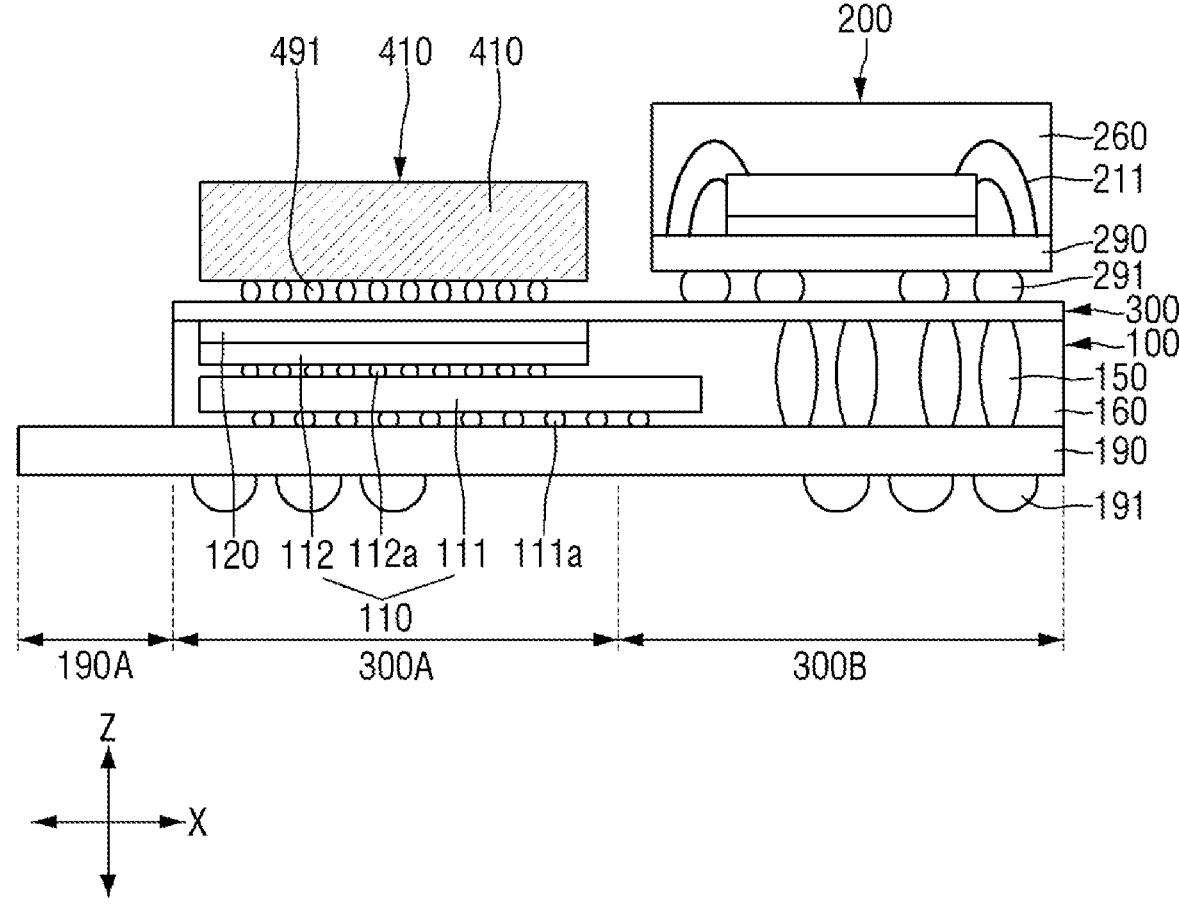

FIG. 14 is a diagram for illustrating a method for manufacturing a semiconductor package according to some embodiments of the present disclosure. FIG. 15 and FIG. 16 are diagrams of intermediate structures corresponding to intermediate steps for illustrating a method for manufacturing a semiconductor package according to some embodiments of the present disclosure.

First, the first package 100 is prepared (S610 in FIG. 14). Specifically, as shown in FIG. 15, the first package 100 includes the first substrate (or package substrate) 190, the first die 110, the vertical wiring 150, the first mold 160, and the like. In the first package 100, the first die 110 is located at one side in the first direction (x-direction), and the vertical wiring 150 is located at the other side in the first direction (x-direction). The landing area (190A in FIG. 16) of the first substrate 190 is not covered with the first mold 160.

Next, the interposer 300 is installed on the first package 100 (S620 of FIG. 14). The first package 100 includes the first area 300A and the second area 300B.

Then, the thermal diffusion structure is installed on the top face of the interposer 300 and in the first area 300A, and the second package is installed on the top face thereof and in the second area 300B (S630 in FIG. 14). Specifically, as shown in FIG. 16, the heat sink 410 is installed on the top face of the interposer 300 and in the first area 300A, and the second package 200 is installed on the top face thereof and in the second area 300B.

Then, as shown in FIG. 2, the heat slug 450 is formed on the top face of the heat sink 410 and the top face of the first substrate 190.

Figure 17:
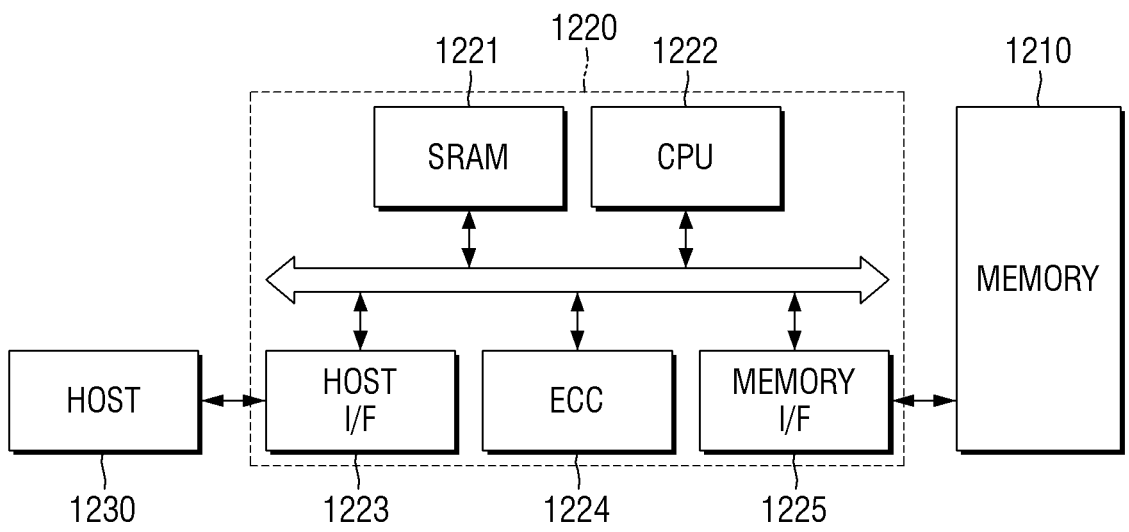
FIG. 17 is a block diagram illustrating a memory card having a semiconductor package according to some embodiments of the present disclosure.

FIG. 17 is a block diagram illustrating a memory card having a semiconductor package according to some embodiments of the present disclosure.

Referring to FIG. 17, the semiconductor package according to some embodiments of the present disclosure may be applied to a memory card 1200.

The memory card 1200 may include a memory controller 1220 that controls data exchange between a host 1230 and a memory 1210. A SRAM 1221 may be used as a working memory of a central processing unit (CPU) 1222. A host interface 1223 may have a data exchange protocol of the host 1230 connected to the memory card 1200. An error correction code (ECC) 1224 may detect and correct an error in data read from the memory 1210. A memory interface (I/F) 1225 may interface with the memory 1210. The central processing unit 1222 may perform various control operations for data exchange of the memory controller 1220.

For example, at least one of the memory 1210 and the central processing unit 1222 may include at least one of semiconductor packages according to some embodiments of the present disclosure.

Figure 18:
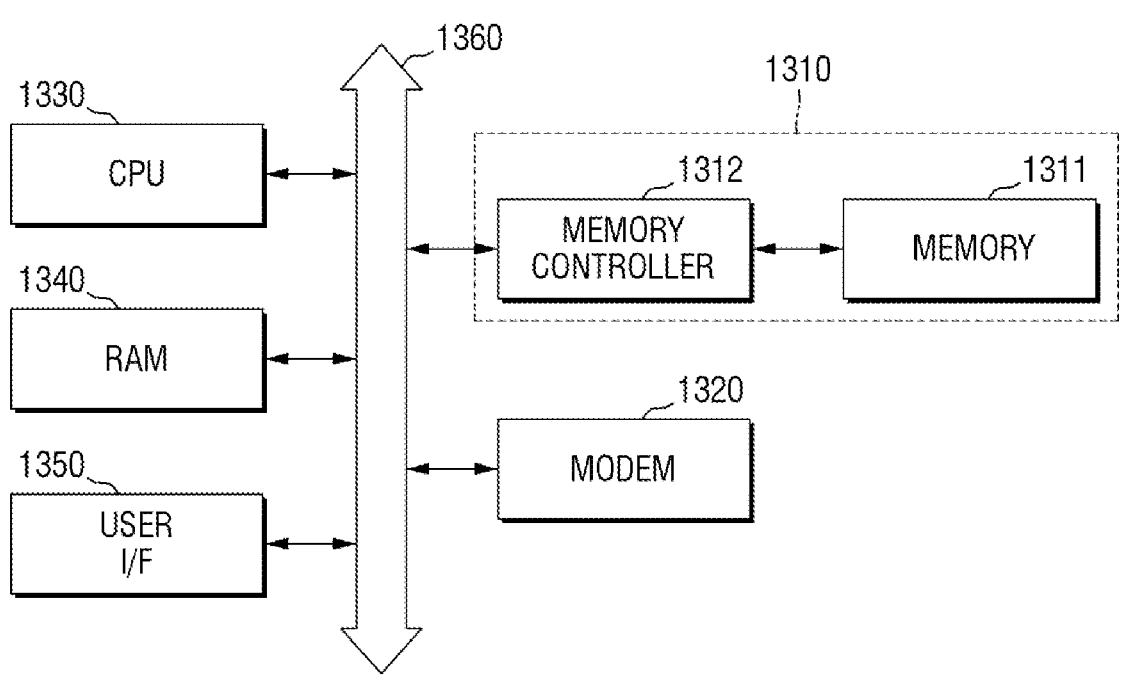
FIG. 18 is a block diagram illustrating an information processing system to which a semiconductor package according to some embodiments of the present disclosure is applied.

FIG. 18 is a block diagram illustrating an information processing system to which a semiconductor package according to some embodiments of the present disclosure is applied.

Referring to FIG. 18, the semiconductor packages according to embodiments of the present disclosure may be applied to the information processing system 1300.

The information processing system 1300 may include a mobile device or a computer. The information processing system 1300 may include a memory system 1310, a modem 1320, a central processing unit (CPU) 1330, a RAM 1340, and a user interface (I/F) 1350 electrically connected to a system bus 1360. The memory system 1310 includes a memory 1311 and a memory controller 1312, and may have substantially the same configuration as that of the memory card 1200 in FIG. 17. Further, at least one of the central processing unit 1330 and the RAM 1340 may include at least one of the semiconductor packages according to some embodiments of the present disclosure.

Data processed by the central processing unit 1330 or data input from an externa device may be stored in the memory system 1310. The information processing system 1300 may be embodied as a memory card, a semiconductor disk device (Solid State Disk), a camera image processor, and other application chipsets. In one example, the memory system 1310 may be embodied as a semiconductor disk device (SSD), and in this case, the information processing system 1300 may stably and reliably store a large amount of data in the memory system 1310.

Although the embodiments of the present disclosure have been described with reference to the accompanying drawings, the present disclosure is not limited to the above embodiments and may be implemented in various different forms. Those of ordinary skill in the technical field to which the present disclosure belongs will be able to understand that the present disclosure may be implemented in other specific forms without changing the technical idea or essential characteristics of the present disclosure. Therefore, it should be understood that the embodiments as described above are not restrictive but illustrative in all respects.

What is claimed is:

1. A semiconductor package comprising:
a first package comprising a first die;
an interposer on the first package and comprising a first area and a second area that is arranged with the first area in a first direction;
a second package on a top face of the interposer in the second area, wherein the second package comprises a second die and a first mold layer covering the second die; and
a thermal diffusion structure on a top face of the interposer in the first area, wherein the thermal diffusion structure is positioned to form a gap along the first direction between a side face of the thermal diffusion structure and the first mold layer;
wherein the thermal diffusion structure is configured so that heat generated in the first die is discharged through the thermal diffusion structure.

2. The semiconductor package of claim 1, wherein the thermal diffusion structure comprises:
a heat sink on the top face of the interposer in the first area; and a heat slug connecting a top face of the heat sink to a package substrate of the first package.

3. The semiconductor package of claim 2, wherein the package substrate of the first package comprises a landing area, and wherein the heat slug comprises a foot in contact with the landing area.

4. The semiconductor package of claim 2, wherein the heat slug comprises:

a first portion on the top face of the heat sink;

a second portion on a top face of the package substrate; and a third portion connecting the first portion and the second portion to each other.

5. The semiconductor package of claim 2, wherein a top face of the heat slug and a top face of the second package are coplanar.

6. The semiconductor package of claim 2, wherein the semiconductor package further comprises a TIM (Thermal Interference Material) between the heat sink and the heat slug.

7. The semiconductor package of claim 2, wherein the heat sink comprises a dummy chip.

8. The semiconductor package of claim 2, wherein the heat sink comprises a metal layer, wherein the metal layer and the interposer are connected to each other via an adhesive.

9. The semiconductor package of claim 1, wherein the thermal diffusion structure comprises a heat slug configured to connect the interposer to a package substrate of the first package in the first area.

10. The semiconductor package of claim 9, wherein the heat slug is connected to the interposer via a thermal interface material (TIM), wherein a top face of the heat slug and a top face of the second package are coplanar.

11. The semiconductor package of claim 1, wherein the first package comprises:

a package substrate, wherein the first die is on the package substrate; and vertical wiring electrically connecting the package substrate to the interposer in the second area;

wherein the first die and the vertical wiring are encased in a second mold layer.

12. The semiconductor package of claim 1, wherein the semiconductor package further comprises a heat-dissipating plate on a top face of the thermal diffusion structure and a top face of the second package.

13. The semiconductor package of claim 12, wherein the top face of the thermal diffusion structure and the top face of the second package are coplanar.

14. The semiconductor package of claim 1, wherein the first die of the first package comprises an application processor, and wherein the second package comprises a memory.

15. A semiconductor package comprising:

a first package comprising a lower die, an upper die stacked on the lower die, a first thermal interface material (TIM) on the upper die, vertical wiring, and a first mold layer covering the lower die, the upper die, a side face of the first TIM, and a side face of the vertical wiring;

an interposer on the first package and comprising a first area and a second area that is arranged with the first area in a first direction, wherein the interposer is in contact with a top face of the first TIM and a top face of the vertical wiring;

a second package on a top face of the interposer in the second area, wherein the second package comprises a second die and a second mold layer covering the second die; and a thermal diffusion structure on a top face of the interposer in the first area, wherein the thermal diffusion structure is positioned to form a gap along the first direction between a side face of the thermal diffusion structure and the second mold layer;

wherein the thermal diffusion structure is configured so that heat generated in the lower die or the upper die is discharged through the thermal diffusion structure, wherein the vertical wiring of the first package vertically overlaps the interposer in the second area, wherein the thermal diffusion structure comprises:

a heat sink on the top face of the interposer in the first area;

a second TIM on the heat sink; and a heat slug in direct contact with the second TIM and configured to cover a side face of the heat sink and a side face of the first package, wherein the heat slug is fixed to a package substrate of the first package.

16. The semiconductor package of claim 15, wherein a top face of the heat slug and a top face of the second package are coplanar, wherein the semiconductor package further comprises a heat-dissipating plate on the top face of the heat slug and the top face of the second package.

17. The semiconductor package of claim 15, wherein the first die of the first package comprises an application processor, and the second package die comprises a memory.

18. A method for manufacturing a semiconductor package, the method comprising:

attaching an interposer to a first package, wherein the first package comprises a first die, and wherein the interposer comprises a first area and a second area that is arranged with the first area in a first direction;

attaching a thermal diffusion structure to the interposer in the first area; and attaching a second package to the interposer in the second area, wherein the second package comprises a second die and a mold layer covering the second die;

wherein the thermal diffusion structure is configured so that heat generated in the first die is discharged through the thermal diffusion structure, wherein the thermal diffusion structure is positioned to form a gap along the first direction between a side face of the thermal diffusion structure and the mold layer.

19. The method of claim 18, wherein attaching the thermal diffusion structure on the interposer in the first area comprises:

attaching a heat sink to the interposer in the first area; and attaching a heat slug to a top face of the heat sink and to a package substrate of the first package.

20. The method of claim 19, wherein the package substrate of the first package comprises a landing area, and wherein the heat slug comprises a foot contacting the landing area.

* * * * *